United States Patent [19]

Ueno et al.

[11] Patent Number: 5,387,819
[45] Date of Patent: Feb. 7, 1995

[54] CRASH DETECTION APPARATUS OF AIR BAG SYSTEM

[75] Inventors: Sadayasu Ueno, Katsuta; Seikou Suzuki, Hitachioota; Hirokazu Fujita, Katsuta; Kazuo Sato, Tokyo, all of Japan

[73] Assignee: Hitachi, Ltd., Tokyo, Japan

[21] Appl. No.: 852,662

[22] Filed: Mar. 17, 1992

[30] Foreign Application Priority Data

Mar. 20, 1991 [JP] Japan .................... 3-055375

[51] Int. Cl.$^6$ ............................. B60R 21/08
[52] U.S. Cl. ..................... 307/10.1; 180/268; 180/270; 180/282; 340/436; 280/735; 280/736
[58] Field of Search ............... 280/735, 728, 735, 736, 280/748; 180/282, 280, 268, 270; 307/121, 10.1, 9.1; 340/436, 438, 61, 53

[56] References Cited

U.S. PATENT DOCUMENTS

| | | | |
|---|---|---|---|
| 4,638,179 | 1/1987 | Mattes et al. | 307/10 |
| 4,950,914 | 8/1990 | Kurihara et al. | 307/10.1 |
| 5,095,750 | 3/1992 | Suzuki et al. | 73/517 B |
| 5,103,667 | 4/1992 | Allen et al. | 73/1 |

FOREIGN PATENT DOCUMENTS

| | | |
|---|---|---|
| 3001780C2 | 9/1984 | Germany . |
| 1-253657 | 10/1989 | Japan . |
| 1-269641 | 10/1989 | Japan . |
| 2-95952 | 6/1990 | Japan . |
| WO89/12830 | 12/1989 | WIPO . |

OTHER PUBLICATIONS

Micro Sysem Technologies 90, H. Reichl, 1st International Conference on Micro Electro, Opto, Mechanic Systems and Components, Berlin, Sep. 1990, pp. 131-136.

Primary Examiner—Marc S. Hoff
Assistant Examiner—Adity A. Krishnan
Attorney, Agent, or Firm—Antonelli, Terry, Stout & Kraus

[57] ABSTRACT

A crash detection apparatus of an air bag system comprises a detection unit for detecting acceleration caused therein by an automobile and outputting electric signals corresponding to the acceleration, a discrimination unit for discriminating, from the signals from the detection unit, a crash signal which is outputted on the basis of the acceleration caused by crash of the automobile, the crash signal being inputted into an inflator to inflate an air bag. The detection unit is a capacitance type semiconductor detector comprising a pair of fixed electrodes and a cantilevered movable electrode disposed between the fixed electrodes and fixed at an end thereof, and a servo control unit is electrically connected to the detection unit so as to form a negative feedback loop, of a detection signal. The servo control unit serves for applying electric energy temporarily to the detection unit to cause electrostatic force in the detection means for restricting movement of the movable electrode caused by acceleration at an initial position thereof. A diagnostic unit is provided for diagnosing the crash detection apparatus on whether or not the crash detection apparatus functions correctly, the diagnostic unit being electrically connected to the servo control unit to input a diagnostic signal to the negative feedback loop thereby to apply electrostatic force for diagnosis between the fixed electrode and the movable electrode.

16 Claims, 4 Drawing Sheets

CRASH DETECTION APPARATUS OF AIR BAG SYSTEM

BACKGROUND OF THE INVENTION

The present invention relates to a crash or collision detection apparatus of an air bag system and, more particularly, to a crash detection apparatus having a diagnostic function used for an air bag system of an automobile.

As a crash detection apparatus of an air bag system in which an automobile crash is detected and an air bag is inflated, there is a known detection apparatus which employs a piezoelectric element making use of a piezoelectric effect or a semiconductor strain gage utilizing piezoelectric resistance. These apparatus are disclosed in U.S. Pat. No. 4,638,179, or in JP A 2-95952, for example. In the former apparatus employing the piezoelectric element, a mass (weight) part is supported by a cantilever made of piezoelectric ceramic, and strain caused in the cantilever by displacement of the mass part due to acceleration is detected through the piezoelectric effect. In the latter detection apparatus, a mass part is supported by the cantilever made of the piezoelectric resistance element, and strain caused in the cantilever in the same manner as mentioned above is detected by the piezoelectric effect.

In this kind of the crash detection apparatus, it is necessary in view of safety to automatically diagnose the crash detection system periodically on whether or not the crash detection apparatus can operate correctly.

In conventional diagnosis of the crash detection apparatus, in case the piezoelectric element is used as a crash sensor, a cantilever of a piezoelectric element is driven by applying electric voltage out of the system and utilizing the piezoelectric effect, and the sensor is diagnosed by the movement of the weight part of the cantilever. However, an electric source of high voltage as a driving voltage is necessary in order to drive the piezoelectric element having the weight. Further, signal source impedance from the piezoelectric element is so high that a charge amplifier of high input impedance is needed as a signal amplifier, which results in being large in scale of diagnostic apparatus.

On the other hand, in case the above-mentioned semiconductor strain gage is used, processing of detection signals is advantageous in that it is difficult to be influenced from externally induced noises and easy to be processed because the signal source impedance is low. However, since there is no means for electrically driving the piezoelectric element for diagnosis, it is necessary to provide a diagnostic means different from the above-mentioned diagnostic means.

SUMMARY OF THE INVENTION

An object of the invention is to provide a crash detection apparatus of an air bag system in which crash detection signals are difficult to be influenced from noises such as externally induced noises and diagnosis of the crash detection system can be effected easily by a simple means.

Another object of the invention is to provide a crash detection apparatus of an air bag system in which a detection range of impact signal can be extended, frequency responsive characteristics can be set to a prescribed range, and it is applicable to wide fields from crash detection systems to movement control systems of automobiles.

A crash detection apparatus of an air bag system according to the invention comprises a detection means for detecting acceleration caused therein by an automobile and outputting electric signals corresponding to the acceleration, a discrimination means for discriminating, from the signals from the detection means, a crash signal which is outputted on the basis of the acceleration caused by crash of the automobile, the crash signal being inputted into an inflator to inflate an air bag, wherein the detection means is a capacitance type semiconductor detector comprising a fixed electrode and a cantilevered movable electrode disposed to oppose the fixed electrode and fixed at an end thereof, and wherein a diagnostic means is provided for diagnosing the crash detection apparatus on whether or not the crash detection apparatus functions correctly by applying electrostatic force for diagnosis between said fixed electrode and said movable electrode.

According to an aspect of the invention, a crash detection apparatus of an air bag system comprises a detection means for detecting acceleration caused therein by an automobile and outputting electric signals corresponding to the acceleration, a discrimination means for discriminating, from the signals from the detection means, a crash signal which is outputted on the basis of the acceleration caused by crash of the automobile, the crash signal being inputted into an inflator to inflate an air bag, wherein the detection means is a capacitance type semiconductor detector comprising a pair of fixed electrodes and a cantilevered movable electrode disposed between the fixed electrodes and fixed at an end thereof, and a servo control means is electrically connected to the detection means so as to form a negative feedback loop of a detection signal, the servo control means being for applying electric energy temporarily to the detection means to cause electrostatic force in the detection means for restricting movement of the movable electrode caused by acceleration at an initial position thereof, and wherein a diagnostic means is provided for diagnosing the crash detection apparatus on whether or not the crash detection apparatus functions correctly, the diagnostic means being electrically connected to the servo control means to input a diagnostic signal to the negative feedback loop thereby to apply electrostatic force for diagnosis between the fixed electrode and the movable electrode.

When as crash acceleration detection means, a capacitance type semiconductor detector is used, a movable electrode of the detector is displaced according to acceleration, the displacement of the movable electrode is detected through the detection of change in capacitance between the movable electrode and fixed electrodes, and occurrence of crash and its extent is judged by a discrimination means. When it is judged that crash energy is generated, an air bag is inflated.

In the diagnosis, a predetermined voltage for diagnosis is generated temporarily, for example, at a regular interval of time during operation, or at a time a key switch is turned on, and applied between the electrodes, thereby to generate electrostatic force. As a result, energy corresponding to crash is applied between the electrodes to displace the movable electrode. When the displacement is detected by making of use of a loop of the crash detection system, the crash detection system is normal, and when it is not detected, the crash detection system including the crash detection detector is judged to be out of order anywhere.

The capacitance type semiconductor detector has a cantilevered movable electrode formed of semiconductor such as silicon, whereby the mass part of the movable electrode can be made small in size and light in weight by a working method of forming microstructure, and a gap between the movable electrode and the fixed electrode can be made very small (micron order). Therefore, it is sufficient to be relatively small in electrostatic force or voltage to be applied to cause the electrostatic force. Namely, assuming that voltage to be applied, a gap between the movable electrode and the fixed electrode, an area of the electrode, and electrostatic force are V, d, S and F, respectively, the following equation (1) is given:

$$F = (\epsilon S V^2)/(2d^2) \tag{1}$$

by selecting the electrode area S and the gap d of suitable values, the electrostatic force F necessary to diagnose can be obtained by application of driving voltage V of usual level. Externally induced noises can be electrically shielded by containing semiconductor devices such as the capacitance type semiconductor detector, signal processing circuit, etc. in a metal container with hermetically shielded terminals.

According to an aspect of the invention, when the crash acceleration detection means is subjected to a servo control. In such a case, the movable electrode is displaced according to the acceleration, however, when the movable electrode starts to move, the detection signal is subjected to negative feedback through the loop of a servo control system to cause electrostatic force between the movable electrode and the fixed electrode to return the movable electrode to the initial position. Therefore, the acceleration can be detected almost without causing the movable electrode to deflect.

By employing the servo control system as mentioned above, improvement of sensitivity and restriction of movement of the movable electrode can be carried out. Further, acceleration detection of wide range (±1 to about 100 G) from vibration acceleration detection for movement control of an automobile such as an active suspension control, to crash acceleration control detection can be effected.

Here, frequency response will be explained.

In case acceleration of about 0 to 10 Hz as in the active suspension control is detected, it is necessary to avoid resonance in order to maintain flatness of detection sensitivity in this range of frequency, so that primary natural frequency f of the movable electrode is necessary to be more than the above-mentioned frequency, at least.

The crash detection system detects acceleration of about 1 KHz. In order to maintain the flatness of the detection sensitivity as mentioned above, the primary natural frequency f of the movable electrode is necessary to be more than the above-mentioned frequency, in usual, 3 KHz. Therefore, in order to maintain the flatness of the acceleration detection sensitivity from the movement control of the automobile to the crash detection system, the above-mentioned primary national frequency f is necessary to be more than the prescribed value, that is, 3 KHz in the above-mentioned example. The primary natural frequency f is given as follows:

$$f = (1/2\pi) \sqrt{(km/ml^2)}, \tag{2}$$

wherein km is spring constant, m is a mass of the movable electrode, and 1 is a length from the center of gravity of the movable-electrode to the fixed end of the cantilevered movable electrode. In the equation (2), the primary natural frequency f can be set to a desired value by making the spring constant km larger and/or by making the mass m or the length smaller, for example. In particular, in case of the capacitance type semiconductor detector, the above-mentioned condition of the primary natural frequency, can be made by using the working method for microstructure.

After the primary natural frequency f is mechanically set as a primary delay, secondary and third delay in the servo control system can be set electrically, and whole frequency response including phase margin can be set to a suitable value.

In the diagnosis of the crash detection system, when a diagnostic signal is triggered from the diagnostic circuit, electrostatic force (driving voltage) corresponding to crash energy is applied on the crash acceleration detector of capacitance type semiconductor detector, whereby the movable electrode is displaced. The diagnosis can be effected by monitoring operation of the crash detection system due to the detection signal corresponding to the displacement of the movable electrode.

DESCRIPTION OF THE EMBODIMENTS

An embodiment of the invention will be described hereunder, referring to FIG. 1.

Figure 1:
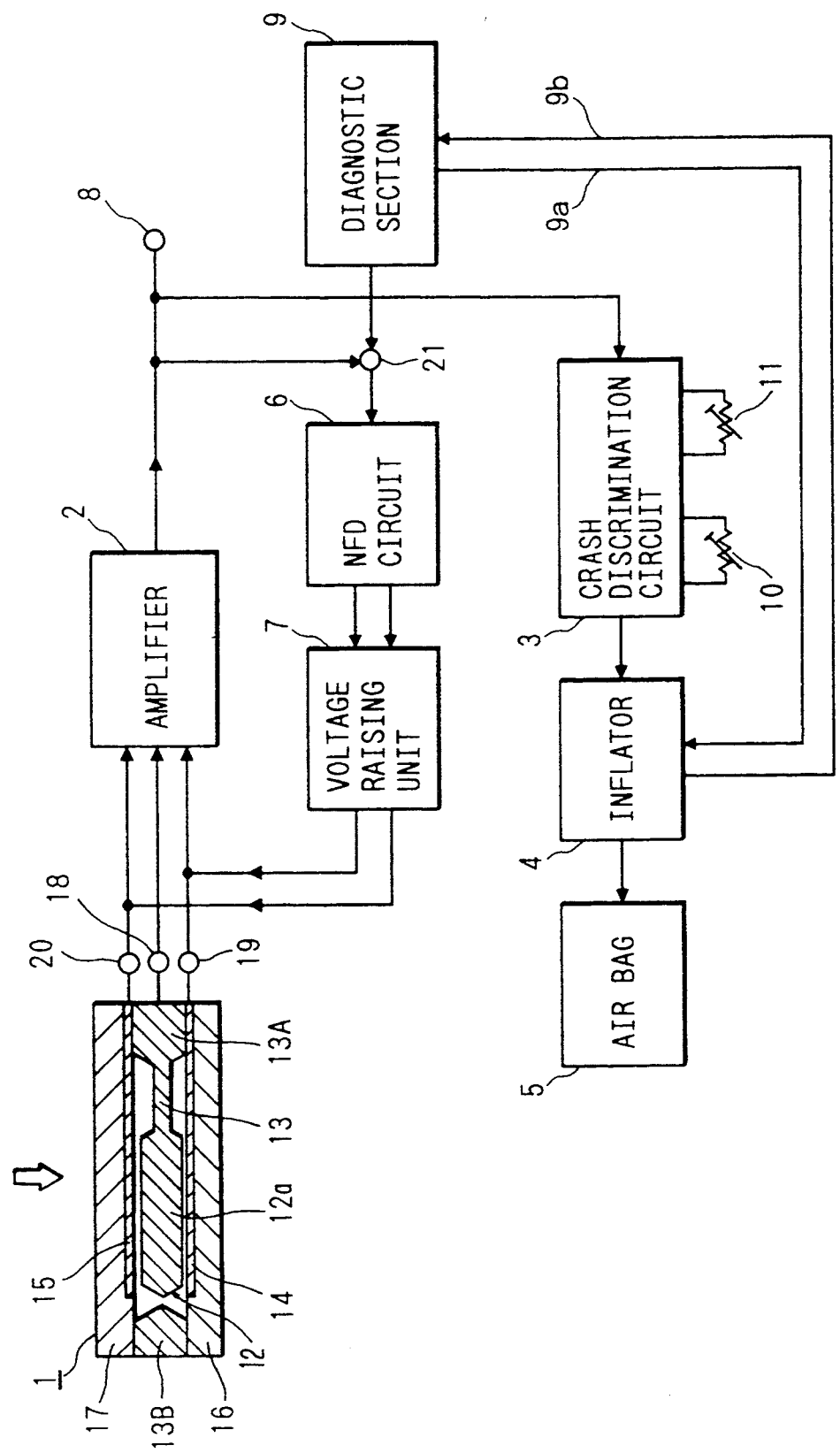
FIG. 1 is a block diagram showing an embodiment of a crash detection apparatus for an air bag system according to the invention.

In FIG. 1, an air bag system includes an air bag 5 installed in an automobile, an inflator 4 having explosive and an ignitor therein to ignite the explosive to inflate the air bag 5, a crash acceleration detector 1, a switched capacitor type amplifier 2 for amplifying signals from the detector 1 and a crash discrimination circuit 3 for discriminating a crash signal from the signals from the detector 1, that is, for judging the signal from the detector 1 on whether or not it is higher than a level at which the crash occurs. The crash acceleration detector 1 is a capacitance type semiconductor detector which comprises a cantilevered movable electrode 12 made of one piece of semiconductor silicon, a pair of fixed electrodes spaced from each other by a spacer 13B and a spacer part 13A of the movable electrode 12. The cantilevered movable electrode 12 has a mass part 12, a bendable part 13 and the spacer part 13A at which the cantilevered movable electrode is fixed. The pair of fixed electrodes 14, 15 each are a thin metal film formed on an insulating glass plate 16, 17. The glass plates 16, 17 sandwich and fix the spacer 13B and the spacer part 13A. The cantilevered movable electrode 12 is formed by a working technique or method for forming microstructure so that a fine gap of 2 to 3 m is kept between the fixed electrode 14 and the mass part 12a (simply referred to as movable electrode) and between the fixed electrode 15 and the movable electrode 12. The switched capacitor type amplifier 2 amplifies a differential of capacitance between the fixed electrode 14 and the movable electrode 12 and between the fixed electrode 15 and the movable electrode 12.

The system further includes a negative feedback circuit (servo control circuit) 6 for effecting a servo control so as to maintain the initial position of the movable electrode which are going to deflect when the movable electrode receives acceleration. The negative feedback circuit 6 has a pulse width modulation function which is used for generating electric supply to be fed to between the electrodes 12 and 14, 15. Output from the negative feedback circuit 6 is raised by a voltage raising unit 7 for making the voltage higher to the extent that electrostatic force corresponding to force applied on the movable electrode by crash acceleration is generated.

The system is provided with a diagnostic circuit section 9. The diagnostic circuit section 9 is for outputting diagnostic signal and a control signal to an adder 21 and the inflator 4, and diagnoses the system whether or not the crash detection system operates correctly. The diagnostic signal is a trigger signal electrically equivalent to a signal obtained through detection of crash experimentally caused in advance, for instance, and the signal has a profile equivalent to crash pulse. When the diagnostic signal is applied on the electrodes, electrostatic force is caused between the electrodes 12 and 14, 15. The diagnostic signal is outputted at a interval of a prescribed period of time, or at a suitable time such as immediately after the ignition switch of the automobile is turned on, for example.

When acceleration as shown by an arrow in FIG. 1 is applied on the crash acceleration detector 1, for example, the movable electrode 12 is moved downwards of FIG. 1, and change in capacitance corresponding to the positional change, that is, $\Delta C = C2 - C1$ takes place, wherein C2 is capacitance between the fixed electrode 15 and the movable electrode 12, and C1 is capacitance between the electrode 14 and the electrode 12.

A signal corresponding to the differential $\Delta C$ of capacitance is amplified by the amplifier 2, and sent to the negative feedback circuit 6 wherein the signal is modulated in pulse width. The pulse width modulated signal is sent to the voltage raising unit 9 to raise its voltage to a prescribed driving voltage, and then feedback to sensor terminals 19, 20. In case the movable electrode 12 is displaced toward the fixed electrode 14, for example, electrostatic force corresponding to $C2 + \Delta C$ is applied between the fixed electrode 15 and the movable electrode 12 and $C1 - \Delta C$, between the electrode 14 and the electrode 12, respectively. As a result, the movable electrode is positioned at a neutral position (initial position) without being deflected to any sides at such a position that the capacitance between the movable electrode 12 and the fixed electrode 14, 15 satisfy the following relation, that is, $C2 = C1$, or $\Delta C = 0$. Crash acceleration signal at this time is in a linear relation with the pulse width. Detection can be effected in a wide range by carrying out the above-mentioned servo control.

Detection signals outputted from the crash acceleration detector 1 is sent to the crash discrimination circuit 3 in which the signals are trimmed by a zero adjusting trimmer 10 and a spun adjusting trimmer 11 so that signal level of zero and spun meet with a prescribed level, and the detection signals are converted into signal level proportional to the crash acceleration, and then sent to an A/D (not shown). After passing the A/D, the signals are judged on whether or not the crash reaches to the extent that the inflator is driven by an integration circuit, a comparator and a multiplier for multiplying a constant incorporated therein.

When a signal or signals of the detection signals are judged to be one to drive the inflator 4, the explosive in the inflator 4 is fired by output from the crash discrimination circuit, thereby to inflate the air bag 5.

Diagnosis of the crash detection system will be explained hereunder.

When diagnostic signals such as trigger pulses are sent to gate 21 periodically during operation, the signals are amplified by the voltage raising unit 7 to generate electrostatic force corresponding to crash energy or crash pulse after being modulated in pulse width by the feedback circuit 6, and then applied to the fixed electrodes 14, 15. As a result, if the crash acceleration detector 1 is normal, the movable electrode 12 displaces and the detection signal becomes a capacitance differential $\Delta C$. The detection signal is sent to the servo control system including the negative feedback circuit 6 and the voltage raising unit 7 through the gate 21 and at the same time, to the crash discrimination circuit 3 in which the signal is judged to be a crash signal and sent to the inflator 4. Here, the diagnostic section 9 send a control signal to the inflator 5 at the same time the diagnostic signal is sent to the detector 1. The inflator 4 is constructed so that the explosive is not ignited and the crash signal is sent to the diagnostic section 9 through an electric line 9b when it receives both of the crash signal from the crash discrimination circuit 3 and the control signal from the diagnostic section 9 via line 9A. The diagnostic section 9 diagnoses the crash detection system by monitoring the crash signal on whether or not the crash detection system is normal, that is, it operates correctly. As a means for preventing the inflator 4 from being ignited when crash signal is sent to the inflator 4 other than the above-mentioned means, the inflator 4 can be constructed so that the explosive is ignited only when the inflator 4 receives more than two crash signals, or so that the explosive is ignited only when the inflator 4 receives both of the crash signal and a signal from a crash switch which is mounted around a front bumper and car body of the automobile and outputs signals when the automobile receives shock.

According to this embodiment, the loop of the servo control system for the crash acceleration detector 1 can be used to cause electrostatic force in the detector 1 without any modification of the loop when the crash detection system is diagnosed, so that the diagnosis can be achieved by a simple diagnostic means. Further, the capacitance type semiconductor detector with the servo control system is used as the crash acceleration detector 1, so that it is possible to detect acceleration of wide range and to set easily a range of the response. The detector is used for an automobile movement control, as in inflating the air bag and can also be used as a system for example, an active suspension system for detecting road conditions through vibration of the automobile and automatically adjusting the suspension according thereto, anti-skid braking system, etc. other than the above-mentioned crash detection system.

Another embodiment of the invention will be described hereunder referring to FIG. 2. In the embodiment, a construction is simplified, compared with the previous embodiment in FIG. 1. The same parts are given the same reference numbers as in FIG. 1, and their explanation is omitted.

In the embodiment, the gate circuit of the servo control system for effecting the negative feedback of a detection signal ΔC is omitted from the embodiment in FIG. 1. When the crash acceleration detector 1 receives acceleration, the movable electrode 12 can move between the fixed electrodes 14, 15 without being restricted by electrostatic force as previously mentioned. The cantilevered movable electrode 12 is formed so that spring constant is larger than in the previous embodiment, and linearity with respect to movement of the movable electrode to the applied acceleration is maintained without being plastically deformed.

When the crash acceleration detector 1 detects acceleration, the movable electrode 12 is deflected according to the acceleration to output a signal corresponding to the capacitance differential ΔC. The signal is sent to the crash discrimination circuit 3, in which the signal is judged on whether or not the signal is generated on the basis of crash acceleration. When the signal is judged to be a crash signal, that is, the signal is one outputted when the detector 1 detects acceleration based on crash of the automobile, the inflator 4 is driven to inflate the air bag 5.

In diagnosis, a diagnostic signal is sent to the servo control circuit 6A which outputs such an electric output which generates electrostatic force in the detector 1 that can deflect the movable electrode 12 to the extent that the movable electrode 12 is deflected by acceleration due to the crash of the automobile. The deflection is detected to output a crash signal which is sent to the inflator 4 through the amplifier 2 and the crash discrimination circuit 3. The diagnostic circuit 9 sending a control signal to the inflator 4 when sends the signal to the servo control circuit, and when the inflator 4 receives both of the control signal and the diagnostic signal, the inflator 4 sends the diagnostic signal only to the diagnostic section 9 without inflating the air bag 5.

Figure 3:
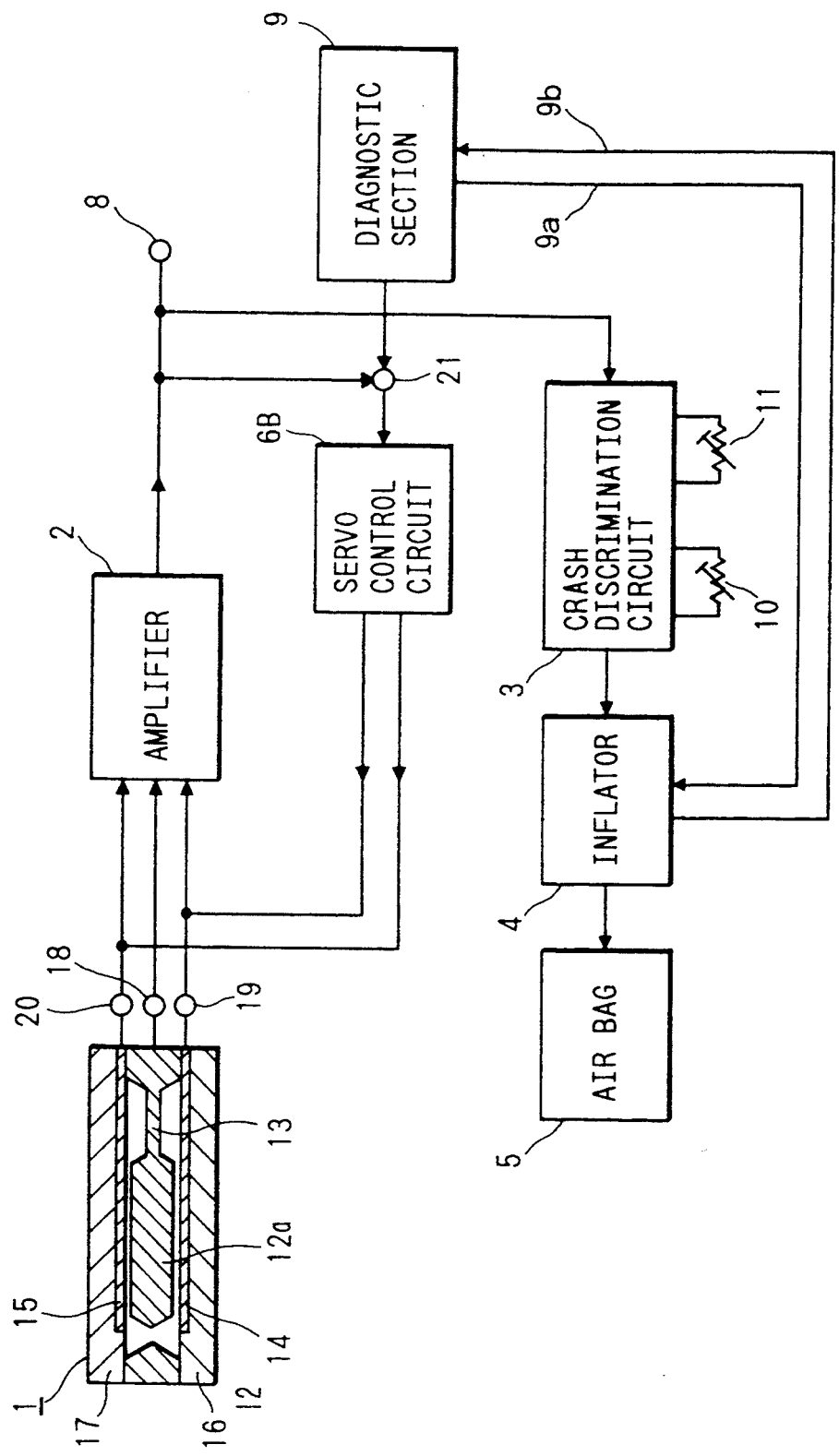
FIG. 3 is a block diagram showing another embodiment of a crash detection apparatus for an air bag system according to the invention.

A further another embodiment of the invention is shown in FIG. 3. In the embodiment, the voltage raising unit is omitted from the previous embodiment in FIG. 1, and the other construction is the same as the embodiment in FIG. 1 except that the crash acceleration detector 1 has the cantilevered movable electrode 12 and the fixed electrodes 14, 15 arranged so as to have a minimized gap between the movable electrode 12 and the fixed electrodes 14, 15.

Another embodiment of the invention will be described referring to FIG. 4, in which the entire diagnostic system of the air bag system including other diagnosis such as diagnosis of crash switch 22, inflator 4, etc. in addition to diagnosis of the crash detection system described referring to FIGS. 1 to 3.

Figure 4:
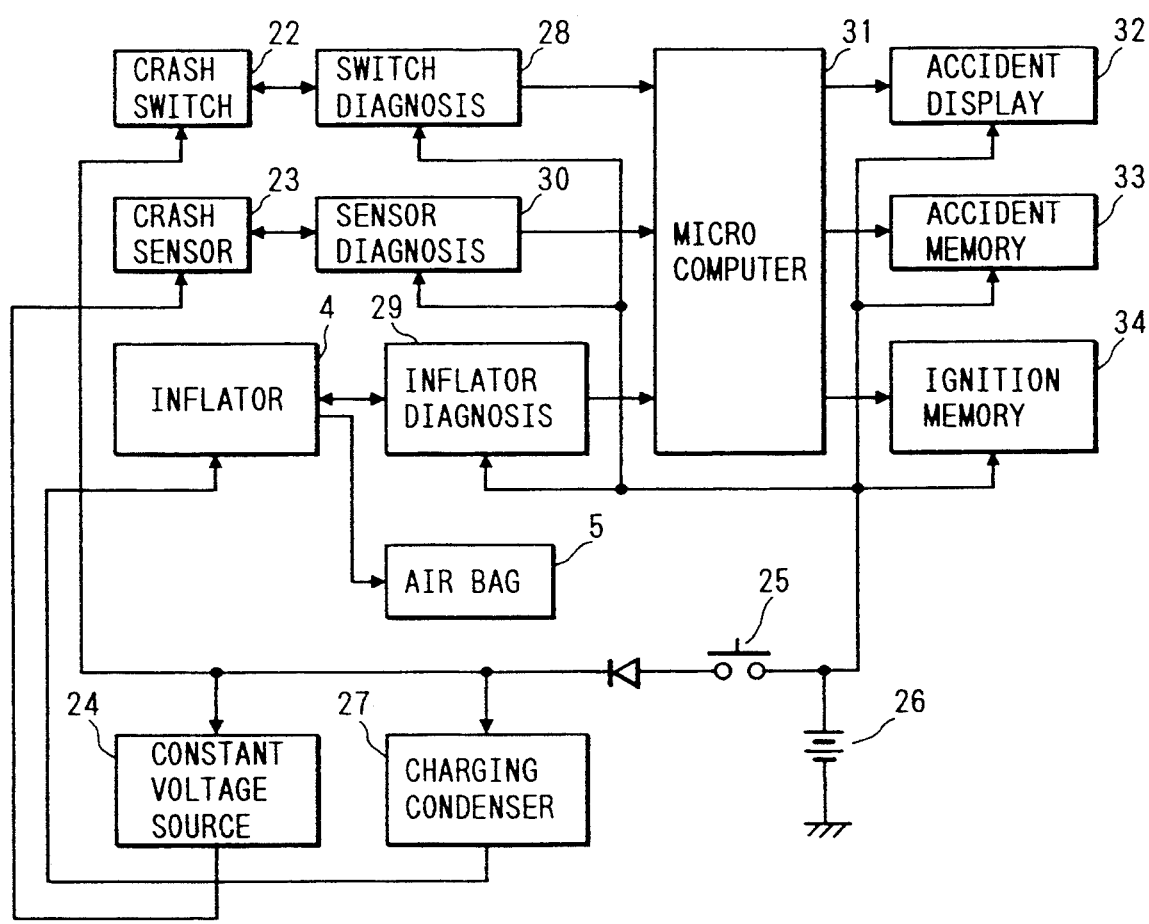
FIG. 4 is a block diagram showing another embodiment of the invention.

In FIG. 4, a crash sensor 23 includes the crash acceleration detector 1 of semiconductor capacitance type, the amplifier 2, the negative feedback circuit 6, the voltage raising circuit 7 and the crash discrimination circuit 3. The inflator 4 and the air bag 5 are driven by the signals from the crash switch 22 and the crash sensor 23 in order to raise reliability thereof. Namely, the crash switch 22 detects surely whether or not the crash takes place, on the condition that the crash is detected by the crash switch 22, it is judged that the crash to the extent that the air bag 5 is necessary to be driven takes place when the detection signal from the crash sensor 23 is more than a prescribed level.

The crash sensor is driven with a power source stabilized by a constant voltage regulator 24. When an ignition switch 25 of the engine is turned on, a charging condenser 27 is charged, whereby even if a battery 27 gets out of order and power is interrupted, the inflator 4 can be supplied with necessary ignition energy from the condenser 27. After the ignition switch 25 is turned on, an instruction of diagnosis of the inflator 4, the crash switch 22 and the crash sensor 23 is outputted from a microcomputer 31, whereby a crash switch diagnostic circuit 28, a crash sensor diagnostic circuit 30 and an inflator diagnostic circuit 29 diagnose them.

Figure 2:
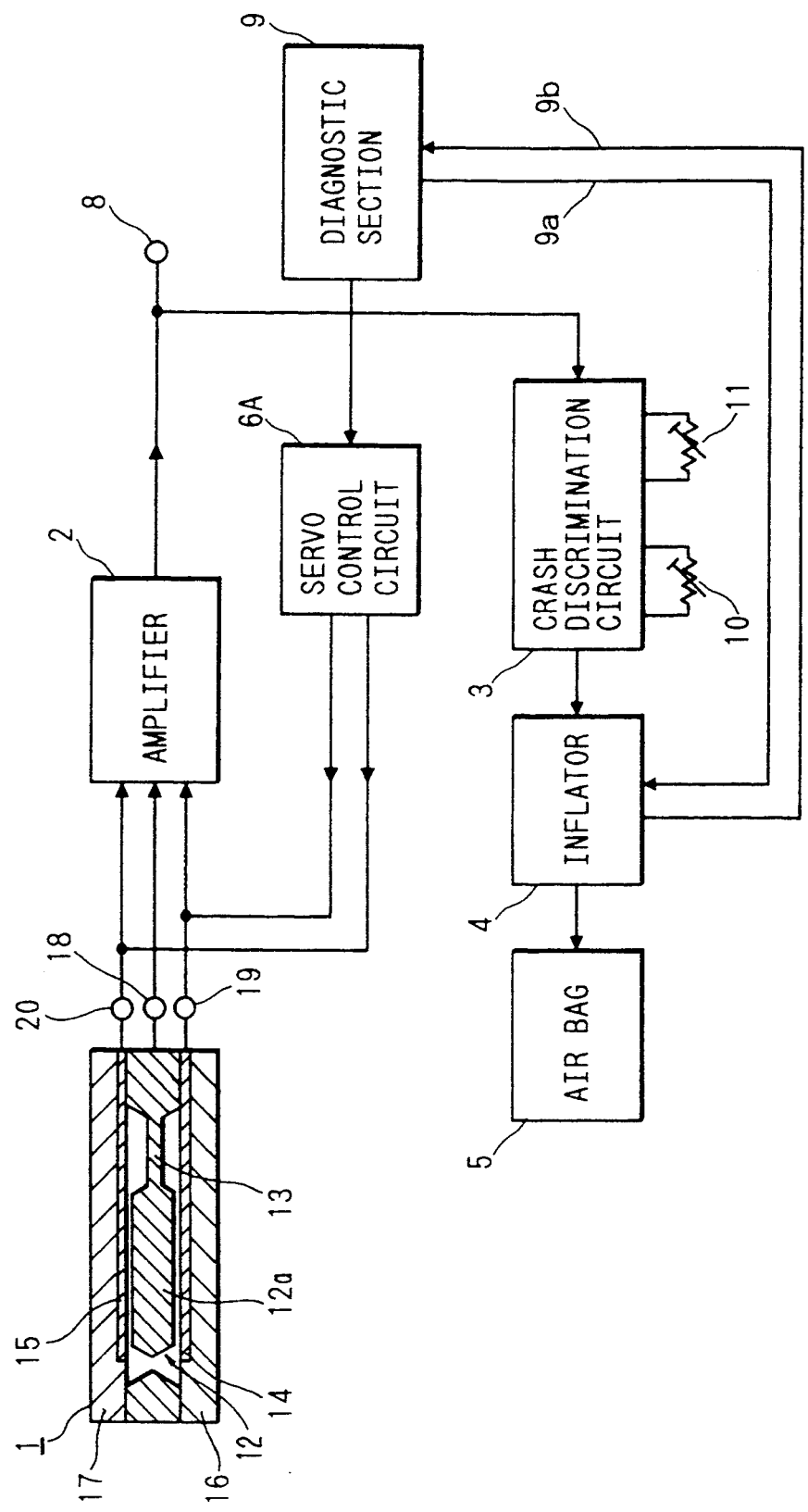
FIG. 2 is a block diagram showing another embodiment of the invention.

The crash sensor diagnostic circuit 30 of them is diagnosed in the same manner as by the diagnostic circuit section 9 of the previous embodiments in FIGS. 1 to 3.

To the crash switch circuit 221, a signal to close intentionally the switch is sent from its diagnostic circuit 28. To the inflator 4, weak current such as current insufficient to ignite the explosive of the inflator 4 is intentionally sent for diagnosis. The state of the current passage is monitored, and if there is abnormal condition, each diagnostic circuit judges it and outputs a signal representative of an accident or a problem.

The microcomputer 31 inputs an accident signal, records the accident and its detection date on the nonvolatile RAM incorporated therein and turns on an accident display lamp 32, warns the driver that repair is necessary. The accident memory 33 records to diagnose the accident, whereby the record can serve as evidence if a real accident takes place.

Further, the ignition memory 34, when the inflator is supplied with crash signal irrespective of not receiving the crash signal from the crash sensor 23, records it as explosion by mistake and interrupts an input to the inflator 4 after then.

Still further, by providing each previous embodiment with a filter for cutting a low frequency component and high frequency component of the output signal from the crash acceleration detector 1, the detection system sufficiently prevented from noises can be obtained and its reliability can be raised further.

What is claimed is:

1. A crash detection apparatus of an air bag system comprising:
    a detection means for detecting acceleration caused therein by an automobile and outputting electric signals corresponding to the acceleration;
    a discrimination means for discriminating, from the signals from said detection means, a crash signal which is outputting on the basis of the acceleration caused by crash of the automobile, said crash signal being inputted into an inflator to inflate an air bag;
    wherein said detection means is a capacitance type semiconductor detector comprising a fixed electrode and a movable electrode disposed to oppose said fixed electrode, and a servo control means is electrically connected to said detection means to form a feedback loop for detection of acceleration and to apply electric energy to said detection means so that electrostatic force is applied between said fixed electrode and said movable electrode to maintain an initial position of said movable electrode; and
    wherein a diagnostic means is provided for diagnosing said crash detection apparatus on whether or not said crash detection apparatus functions correctly by applying an electric signal for diagnosis to said feedback loop of said servo control means so as to apply electrostatic force between said fixed electrode and said movable electrode for diagnosis.

2. A crash detection apparatus of an air bag system according to claim 1, wherein said electrostatic force causes displacement in said movable electrode corresponding to a displacement caused by a crash acceleration of the automobile.

3. A crash detection apparatus of an air bag system according to claim 1, wherein said movable electrode is disposed between a pair of fixed electrodes, and said diagnostic means outputs a diagnostic signal for generating a differential in capacitance between said movable and fixed electrodes, which differential corresponds to a differential caused by a crash acceleration of the automobile.

4. A crash detection apparatus of an air bag system according to claim 3, wherein said diagnostic means is electrically connected to said inflator, said inflator being constructed so that upon receiving signals from both said detection means and said diagnostic means, the signal from said detection means is sent to said diagnostic means without inflating said air bag, whereby said diagnostic means diagnoses said crash detection apparatus by monitoring the signals outputted to said detection means and the signal inputted from said inflator.

5. A crash detection apparatus of an air bag system comprising:
- a detection means for detecting acceleration caused therein by an automobile and outputting electric signals corresponding to the acceleration;
- a discrimination means for discriminating, from the signals from said detection means, a crash signal which is outputted on the basis of the acceleration caused by crash of the automobile, said crash signal being inputted into an inflator to inflate an air bag;
- wherein said detection means is a capacitance type semiconductor detector comprising a pair of fixed electrodes and a movable electrode between said fixed electrodes, and a servo control means is electrically connected to said detection means so as to form a negative feedback loop of a detection signal, said servo control means being for applying electric energy to said detection means to cause electrostatic force in said detection means for restricting movement of said movable electrode caused by acceleration at an initial position thereof; and
- wherein a diagnosis means is provided for diagnosing said crash detection apparatus on whether or not said crash detection apparatus functions correctly, said diagnostic means being electrically connected to said servo control means to input a diagnostic signal temporarily to said negative feedback loop so as to apply electrostatic force for diagnosis between said fixed electrode and said movable electrode.

6. A crash detection apparatus of an air bag system according to claim 5, wherein said diagnostic means is electrically connected to said discrimination means to diagnose said crash detection apparatus on the basis of the diagnostic signal and the detection signal from said discrimination means.

7. A crash detection apparatus of an air bag system according to claim 5, wherein said electric energy to be inputted to said detection means is in pulse form subjected to pulse width modulation.

8. A crash detection apparatus of an air bag system according to claim 5, wherein the diagnostic signal is pulse voltage such that an electrostatic force which is equivalent to a predetermined electrostatic force caused by a crash pulse is caused in said detection means.

9. A crash detection apparatus of an air bag system according to claim 5, wherein the energy to be inputted into said detection means is raised in voltage by a voltage raising unit.

10. A crash detection apparatus of an air bag system according to claim 5, wherein said detection means is provided with a non-volatile memory for recording a diagnosis result and the date of the diagnosis.

11. A crash detection apparatus of an air bag system according to claim 5, wherein a filtration means is provided for cutting low and high frequency parts of a signal outputted from said capacitance type semiconductor detector.

12. An acceleration detection apparatus of an automobile comprising:
- a detection means for detecting acceleration caused therein by an automobile and outputting electric signals corresponding to the acceleration;
- a discrimination means for discriminating, from the signals from said detection means, a signal which is outputted on the basis of acceleration higher than a predetermined level;
- wherein said detection means is a capacitance type semiconductor detector comprising a pair of fixed electrodes and a movable electrode disposed between said fixed electrodes, and a servo control means is electrically connected to said detection means so as to form a negative feedback loop of a detection signal, said servo control means being for applying electric energy to said detection means to cause electrostatic force in said detection means for restricting movement of said movable electrode caused by acceleration at an initial position thereof; and
- wherein a diagnostic means is provided for diagnosing said acceleration detection apparatus on whether or not said detection apparatus functions correctly, said diagnostic means being electrically connected to said servo control means to input a diagnostic signal to said negative feedback loop to apply electrostatic force for diagnosis between said fixed electrode and said movable electrode.

13. An acceleration detection apparatus according to claim 12, further comprising a device responsive to the output signal of the discrimination means for enabling a crash associated operation of the automobile.

14. An acceleration detection apparatus according to claim 13, wherein the device is an inflator of an air bag.

15. A crash detection apparatus of an air bag system comprising:
- a detection means for detecting acceleration caused therein by an automobile and outputting electric signals corresponding to the acceleration;
- a discrimination means for discriminating, from the signals from said detection means, a crash signal which is outputted on the basis of the acceleration caused by crash of the automobile, said crash signal being inputted into an inflator to inflate an air bag;
- wherein said detection means comprises a movable electrode and a servo control means is electrically connected to said detection means so as to form a negative feedback loop of a detection signal, said servo control means applying electric energy to said detection means to cause electrostatic force in said detection means for restricting movement of said movable electrode caused by acceleration at an initial position thereof; and wherein a diagnostic means is provided for diagnosing said crash detection apparatus on whether or not said crash detection apparatus functions correctly, said diagnostic means being electrically connected to said servo control means to input a diagnostic signal temporarily to said negative feedback loop to apply the electrostatic force for diagnosis to said movable electrode.

16. A crash detection apparatus of an air bag system according to claim 13, wherein said diagnostic means is electrically connected to said discrimination means to diagnose said crash detection apparatus on the basis of the diagnostic signal and the detection signal from said discrimination means.

* * * * *